(12) United States Patent
Vinet et al.

(10) Patent No.: US 9,601,511 B2
(45) Date of Patent: Mar. 21, 2017

(54) LOW LEAKAGE DUAL STI INTEGRATED CIRCUIT INCLUDING FDSOI TRANSISTORS

(71) Applicants: COMMISSARIAT A L'ENERGIE ATOMIQUE ET AUX ENERGIES ALTERNATIVES, Paris (FR); INTERNATIONAL BUSINESS MACHINES CORPORATION, Armonk, NY (US); STMICROELECTRONICS, INC., Coppell, TX (US)

(72) Inventors: Maud Vinet, Rives sur Fure (FR); Kangguo Cheng, Albany, NY (US); Bruce Doris, Slingerlands, NY (US); Laurent Grenouillet, Rives sur Fure (FR); Ali Khakifirooz, San Jose, CA (US); Yannick Le Tiec, Crolles (FR); Qing Liu, Guilderland, NY (US)

(73) Assignees: COMMISSARIAT A L'ENERGIE ATOMIQUE ET AUX ENERGIES ALTERNATIVES, Paris (FR); INTERNATIONAL BUSINESS MACHINES CORPORATION, Armonk, NY (US); STMicroelectronics, Inc., Coppell, TX (US)

( * ) Notice: Subject to any disclaimer, the term of this patent is extended or adjusted under 35 U.S.C. 154(b) by 0 days.

(21) Appl. No.: 14/771,016

(22) PCT Filed: Feb. 28, 2013

(86) PCT No.: PCT/EP2013/054081
§ 371 (c)(1),
(2) Date: Aug. 27, 2015

(87) PCT Pub. No.: WO2014/131459
PCT Pub. Date: Sep. 4, 2014

(65) Prior Publication Data
US 2016/0013206 A1  Jan. 14, 2016

(51) Int. Cl.
*H01L 27/12* (2006.01)
*H01L 21/762* (2006.01)
(Continued)

(52) U.S. Cl.
CPC ...... *H01L 27/1203* (2013.01); *H01L 21/2236* (2013.01); *H01L 21/26513* (2013.01);
(Continued)

(58) Field of Classification Search
CPC . H01L 21/84; H01L 29/0653; H01L 27/1203; H01L 29/0649; H01L 27/12; H01L 21/762
See application file for complete search history.

(56) References Cited

U.S. PATENT DOCUMENTS 5,849,621 A   12/1998   Gardner et al.
6,184,566 B1   2/2001   Gardner et al.
(Continued)

FOREIGN PATENT DOCUMENTS

WO   WO 2012/160071 A1   11/2012

OTHER PUBLICATIONS

International Search Report issued Oct. 22, 2013 in PCT/EP2013/054081.
(Continued)

*Primary Examiner* — Jerome Jackson, Jr.
(74) *Attorney, Agent, or Firm* — Oblon, McClelland, Maier & Neustadt, L.L.P.

(57) ABSTRACT

An integrated circuit, including: a UTBOX layer; a first cell, including: FDSOI transistors; a first STI separating the transistors; a first ground plane located beneath one of the
(Continued)

transistors and beneath the UTBOX layer; a first well; a second cell, including: FDSOI transistors; a second STI separating the transistors; a second ground plane located beneath one of the transistors and beneath the UTBOX layer; a second well; a third STI separating the cells, reaching the bottom of the first and second wells; a deep well extending continuously beneath the first and second wells, having a portion beneath the third STI whose doping density is at least 50% higher than the doping density of the deep well beneath the first and second STIs.

14 Claims, 5 Drawing Sheets

(51) Int. Cl.
*H01L 21/223* (2006.01)
*H01L 21/265* (2006.01)
*H01L 21/84* (2006.01)
*H01L 27/092* (2006.01)
*H01L 29/06* (2006.01)
*H01L 21/8238* (2006.01)

(52) U.S. Cl.
CPC .. *H01L 21/76229* (2013.01); *H01L 21/76237* (2013.01); *H01L 21/84* (2013.01); *H01L 27/0928* (2013.01); *H01L 29/0649* (2013.01); *H01L 21/823878* (2013.01); *H01L 21/823892* (2013.01)

(56) References Cited

U.S. PATENT DOCUMENTS

| 2004/0097051 A1 | 5/2004 | Wu et al. |
| 2010/0055856 A1 | 3/2010 | Hong et al. |
| 2011/0175190 A1* | 7/2011 | Koburger, III .... H01L 21/76229 257/506 |

OTHER PUBLICATIONS

L. Grenouillet, et al., "UTBB FDSOI transistors with dual STI for a multi-$V_t$ strategy at 20nm node and below", Electron Devices Meeting, IEDM, XP 32341666A, 2012, 4 pages.

L. Grenouillet, et al., "Ground Plane Optimization for 20nm FDSOI Transistors with Thin Buried Oxide", SOI, Conference, SOI, IEEE, XP 32299710A, 2012, 2 pages.

* cited by examiner

LOW LEAKAGE DUAL STI INTEGRATED CIRCUIT INCLUDING FDSOI TRANSISTORS

The present invention relates to semiconductor integrated circuits and, more specifically, integrated circuits manufactured on a SOI (Silicon on Insulator) substrate.

In SOI technology, a thin layer of silicon (typically featuring a thickness of a few nanometers) is separated from a semiconductor substrate by a relatively thick electrically insulating layer (typically featuring a thickness of a few tens of nanometers).

Integrated circuits in SOI technology offer a number of advantages compared to traditional "bulk" technology for CMOS (Complementary Metal Oxide Semiconductor) integrated circuits. SOI integrated circuits typically provide a lower power consumption for a same performance level. Such circuits also feature a reduced stray capacitance, allowing an increase of commutation speeds. Furthermore, the latch-up phenomena encountered in bulk technology can be mitigated. Such circuits are therefore particularly adapted to SoC (System on Chip) or MEMS (Micro electro-mechanical systems) applications. SOI circuits also are less sensitive to ionizing radiations, making them more reliable than bulk-technology circuits in applications where said radiations may induce operating problems, such as aerospace applications. SOI integrated circuits can include memory components such as SRAM (Static Random Access Memory), or logic gates.

Much research has been conducted on reducing the static power consumption of logic gates, while increasing their commutation speed. Some integrated circuits combine both logic gates with low power consumption, and logic gates with high commutation speed. In order to integrate two such logic gates on a same integrated circuit, it is known to lower the threshold voltage (typically noted $V_T$ or $V_{th}$) of some transistors belonging to the high-speed logic gates, and to increase the threshold voltage of some other transistors of the low-consumption logic gates. In bulk technology, threshold voltage modulation is implemented by differentiating the doping level of the semiconductor channel of these transistors. However, FDSOI (Fully Depleted Silicon On Insulator) transistors have, by design, a depleted channel, featuring a low doping level (typically $10^{15}$ cm$^{-3}$). Due to this low doping level, it is not possible to modulate the threshold voltage of transistors with the method used in bulk technology. Some studies have proposed integrating different gate materials in otherwise identical transistors, in order to obtain differing threshold voltages. However, implementing this solution is technically challenging and economically prohibitive.

In order to obtain different threshold voltages for transistors in FDSOI technology, it is also known to include an electrically biased ground plane (also named back plane, or back gate), located between a thin electrically insulating oxide layer, and the silicon substrate. This technology is often known as UTBOX (for Ultra-Thin Buried OXide layer). By adjusting the type of doping of, and the electrical bias applied to these ground planes, it is therefore possible to define several ranges of threshold voltages for said transistors. For example, it is possible to define low-threshold voltage transistors (LVT for Low Vt, typically 400 mV), high-threshold voltage transistors (HVT for High Vt, typically 550 mV) and medium or standard threshold voltage transistors (SVT for Standard Vt, typically 450 mV).

There is a growing need for adjacent cells including transistors having different threshold voltages. FIG. 1 illustrates an example of a dual STI integrated circuit 9 including FDSOI (Fully Depleted Silicon On Insulator) transistors according to the prior art. Such a circuit is designed to allow an independent biasing for the ground planes of the cells and is also designed to provide the highest possible integration density.

The integrated circuit 9 includes FDSOI transistors 1a, 1b, 1c and 1d. Transistors 1a and 1b form a first cell, whereas transistors 1c and 1d form a second cell. These transistors are located on an ultra-thin buried oxide (UTBOX) insulator layer 4. In order to provide an electrical isolation between transistors:

- transistor 1a is located between an isolation trench 22 and an isolation trench 23;
- transistor 1b is located between an isolation trench 23 and an isolation trench 24;
- transistor 1c is located between an isolation trench 24 and an isolation trench 25;
- transistor 1d is located between an isolation trench 25 and an isolation trench 26.

A semiconductor well 93 lies below the UTBOX layer 4, under the transistors 1a and 1b. A semiconductor well 94 lies below the UTBOX layer 4, under the transistors 1c and 1d. The semiconductor wells 93 and 94 have a p-type doping. A ground plane 31 (also named back gate or back plane) lies beneath transistor 1b. The upper surface of ground plane 31 is contacting the UTBOX layer 4 while its lower surface contacts the well 93. The upper part of well 93 constitutes a ground plane under transistor 1a. A ground plane 32 lies beneath transistor 1c. The upper surface of ground plane 32 is contacting the UTBOX layer 4 while its lower surface contacts the well 94. The upper part of well 94 constitutes a ground plane under transistor 1d. Ground planes 31 and 32 have an n-type doping. A p-type substrate 91 is separated from wells 93 and 94 by a deep n-well 92.

A V1 biasing is applied on well 93. A V2 biasing is applied on well 94. A V3 biasing is applied on deep n-well 92. A V4 biasing is applied on substrate 91. To avoid additional biasing contacts, the ground plane 31 is biased through well 93 and the ground plane 32 is biased through well 94. Thus, short shallow trench isolations (SSTI) 22 and 23 are used to guarantee a semiconductor continuity between the V1 bias contact, the well 93 and the ground plane 31. Similarly, short shallow trench isolations 25 and 26 are used to guarantee a semiconductor continuity between the V2 bias contact, the well 94 and the ground plane 32. These short shallow trench isolations do not reach the bottom of wells 93 and 94.

With different V1 and V2 bias voltages, to avoid a direct bypass current between wells 93 and 94, a deep shallow trench isolation (DSTI) 24 is located between transistors 1b and 1c and between wells 93 and 94. This deep shallow trench isolation reaches the bottom of wells 93 and 94. The deep trench 24 protrudes inside the deep n-well 92. With a positive V3 bias voltage for deep n-well 92, voltages V1 and V2 may be statically or dynamically set on a large range. The threshold voltages of the transistors of both cells can thus be easily and independently set on a very large range. Deep shallow trench isolations 21, 27 and 28 extending to the same depth as DSTI 24 are also provided.

Due to the use of two different depths for the STIs, such an integrated circuit is commonly named dual STI. Wells 93 and 94 can be biased independently and a good integration density can be obtained.

However, such an integrated circuit suffers from several drawbacks.

When different voltages V1 and V2 are used, a non negligible leakage current flows between wells 93 and 94.

When voltages V1 or V2 differ from V4, a leakage current also flows between well 93 or 94 and substrate 91, through the deep n-well 92.

Figure 5:
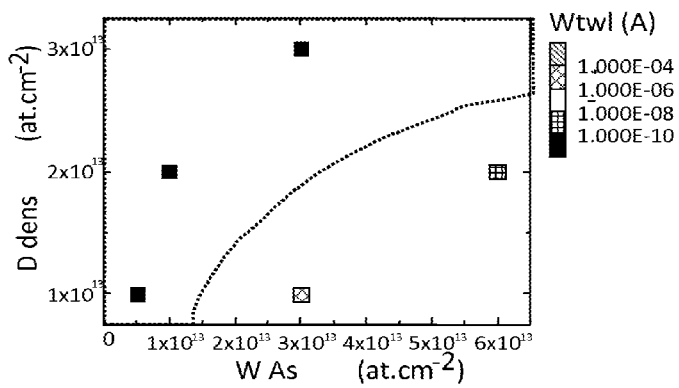

FIG. 5 is a diagram illustrating the well to well leakage depending on the well doping (Was) and depending on the deep n-well doping (Ddens). The domain included in the dashed line corresponds to an example of acceptable well to well leakage values. This diagram shows that an increase of the deep n-well doping reduces the well to well leakage.

Figure 6:
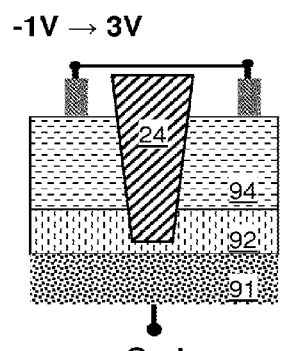
Figure 7:
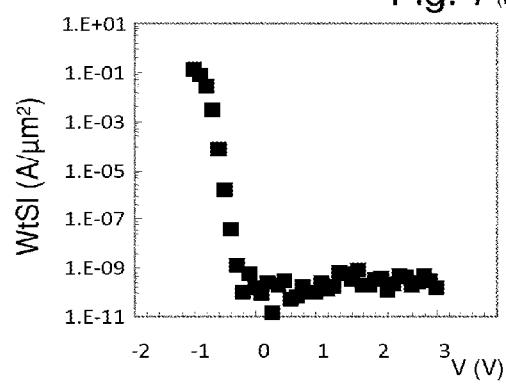

FIG. 6 illustrates an example of a biasing configuration where V1 and V2 are varied on a given voltage range and where V4 is a ground voltage. FIG. 7 is a diagram illustrating the well to substrate leakage current depending on the V1 bias. This diagram shows that the well to substrate leakage may reach significant values for some V1 biasing values.

To overcome the well to well leakage problem, the depth of the DSTIs cannot be significantly increased both because part of the deep n-well would not be biased anymore and because deeper DSTIs cannot be formed with usual processes.

Increasing the doping of the deep n-well 92 could reduce the well to well leakage current. However, such a doping increase may alter the well to substrate leakage current and may create circuit defects.

The usual process for doping the deep n-well 92 is performed by ion implantation after a STI filling step. The deep n-well 92 doping has to be limited because it would otherwise involve a difficult counterdoping of wells 93 and 94, because it introduces impurities into the UTBOX layer 4, and because it may create various defects of the integrated circuits.

Figure 8:
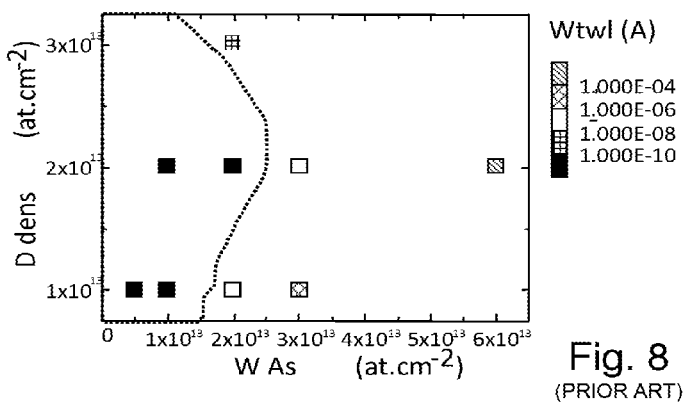

FIG. 8 is a diagram illustrating the well to substrate leakage depending on the well doping (Was) and depending on the deep n-well doping (Ddens). The domain included in the dashed line corresponds to an example of acceptable well to substrate leakage values. This diagram shows that an increase of the deep n-well doping may in fact increase the well to substrate leakage current.

Thus, an increase of the deep n-well doping is not a suitable solution for overcoming the highlighted drawbacks.

Thus, there is a need for an integrated circuit overcoming these drawbacks and involving reduced changes of the manufacturing process. Additionally, there is a need for an integrated circuit having a reduced biasing resistance for its deep n-well.

The invention relates to an integrated circuit, including:
a UTBOX type insulator layer;
a first cell, comprising:
 first and second FDSOI field effect transistors located above said UTBOX layer;
 a first shallow trench isolation separating said first and second transistors;
 a first semiconductor ground plane having a first type of doping and located beneath said first transistor and beneath said insulator layer;
 a first semiconductor well extending continuously beneath said first and second transistors and contacting said first ground plane, said first well having a second type of doping different from the first type;
a second cell, comprising:
 third and fourth FDSOI field effect transistors located above said UTBOX layer;
 a second shallow trench isolation separating said third and fourth transistors;
 a second semiconductor ground plane having the first type of doping and located beneath said third transistor and beneath said insulator layer;
 a second semiconductor well extending continuously beneath said third and fourth transistors and contacting said second ground plane, said second well having the second type of doping;
a third shallow trench isolation separating said first and second cells, crossing said insulator layer and reaching the bottom of said first and second wells;
a deep well having the first type of doping and extending continuously beneath said first and second wells, the deep well having a portion beneath said third shallow trench isolation whose doping density is at least 50% higher than the doping density of the deep well beneath said first and second shallow trench isolations.

In an embodiment, the doping density of said portion of the deep well is at least 50% higher than the average doping density of the deep well.

In an embodiment, said portion extends on at least 30 nm under said third shallow trench isolation.

In an embodiment, said portion extends into the bottom of said deep well.

In an embodiment, the distance between said portion and the bottom of the deep well is comprised between 10 and 50 nm.

In an embodiment, said first type of doping is of the n type.

In an embodiment, the integrated circuit further comprises:
a biasing contact for the deep well;
a fourth shallow trench isolation separating said biasing contact from the first and second cells, said deep well comprising a portion located beneath said fourth shallow trench isolation and whose doping density is at least 50% higher than the doping density of the deep well beneath said first and second shallow trench isolations.

In an embodiment, the integrated circuit further comprises a biasing circuit programmed to bias said first and second wells with respective different voltages.

The invention also relates to a method for manufacturing an integrated circuit, comprising the steps of:
providing a stack including a semiconductor substrate, a UTBOX type insulator layer lying above said semiconductor substrate and a semiconductor layer lying above said insulator layer;
in said stack, forming first and second grooves;
in said stack, forming a third groove, said third groove extending in the semiconductor substrate deeper than said first and second grooves and being located between said first and second grooves;
doping a portion of the semiconductor substrate at the bottom of the third groove with a first type of doping;
filling said first, second and third grooves with insulation material to form first, second and third shallow trench isolations respectively;
doping part of the semiconductor substrate with the first type of doping to form a deep well extending deeper than said third shallow trench isolation and extending continuously below said first and second shallow trench isolations and contacting said doped portion, said doped portion having a doping density at least 50% higher than the doping density of the deep well beneath said first and second shallow trench isolations;

doping part of the semiconductor substrate to form first and second wells on opposite sides of said third shallow trench isolation, said first and second wells having a second type of doping different from the first type and extending deeper than the bottom of the first and second shallow trench isolations, said third shallow trench isolation extending deeper than the bottom of the formed first and second wells;

doping an upper portion of said first and second wells to form ground planes under said insulator layer, the formed ground planes having the first type of doping.

In an embodiment, the method further comprises the steps of:

forming first and second FDSOI field effect transistors separated by said first shallow trench isolation;

forming third and fourth FDSOI field effect transistors separated by said second shallow trench isolation, the respective source, drain and channel of each of the first to fourth transistors being formed in said semiconductor layer.

In an embodiment, said step of doping said portion of the semiconductor substrate includes a step of ionic implantation in the bottom of the third groove.

In an embodiment, said step of doping said portion of the semiconductor substrate is performed by plasma doping.

In an embodiment, said doped portion extends at least 30 nm under the bottom of said third groove.

In an embodiment, the bottom of said doped portion extends into the bottom of the formed deep well.

Figure 1:
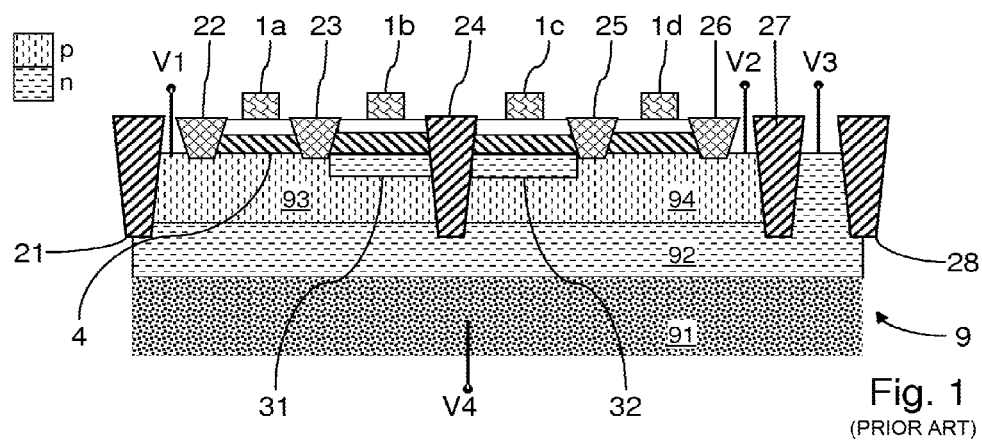
Figure 2:
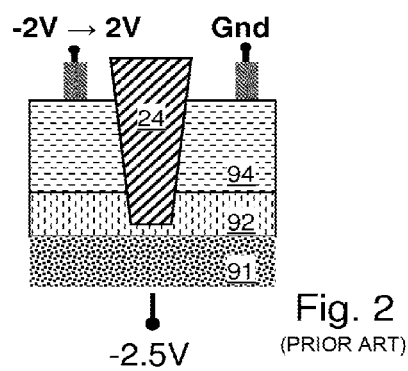
FIGS. 2 and 3 illustrate an example of a biasing configuration where V1 differs from V2, with different depths of the DSTI 24. The DSTI 24 of the integrated circuit of FIG. 2 extends deeper into the deep n-well 92 than the DSTI 24 of FIG. 3.
Figure 3:
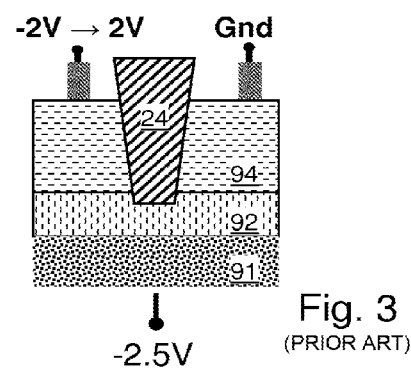
Figure 4:
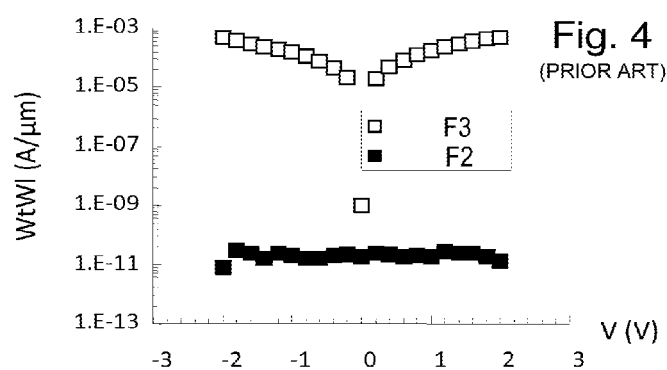
FIG. 4 is a diagram illustrating the respective leakages between wells 93 and 94 of both integrated circuits. This diagram shows that a deeper DSTI 24 reduces the well to well leakage current.
Figure 9:
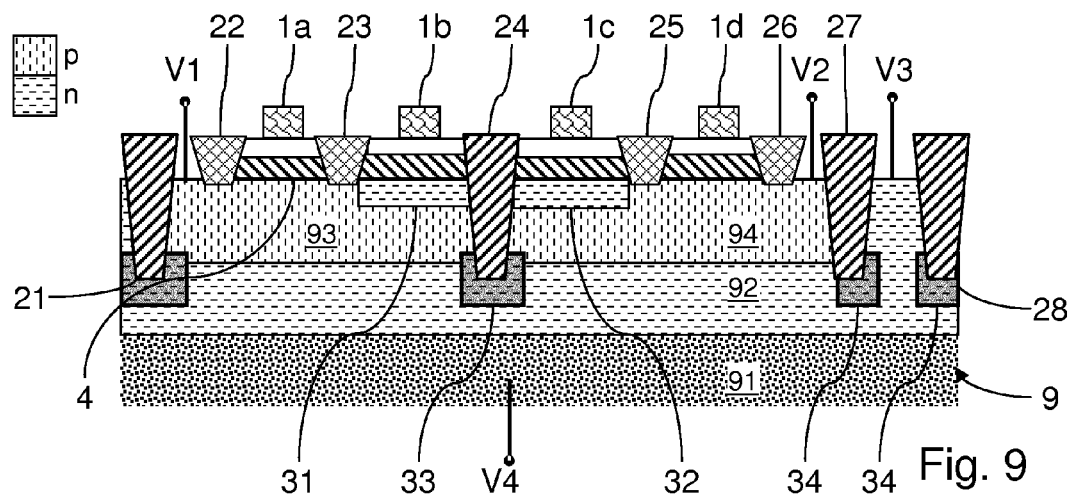
Figure 10:
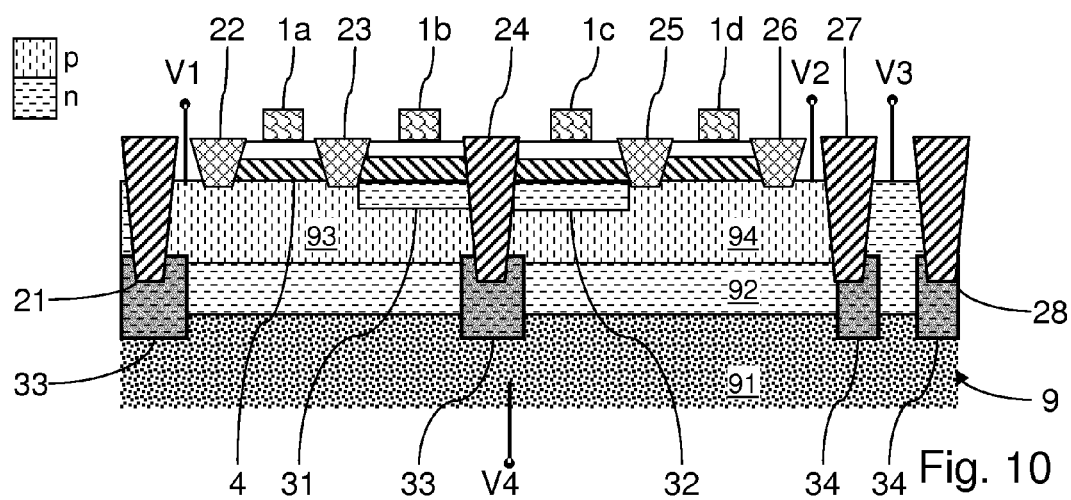
Figure 11:
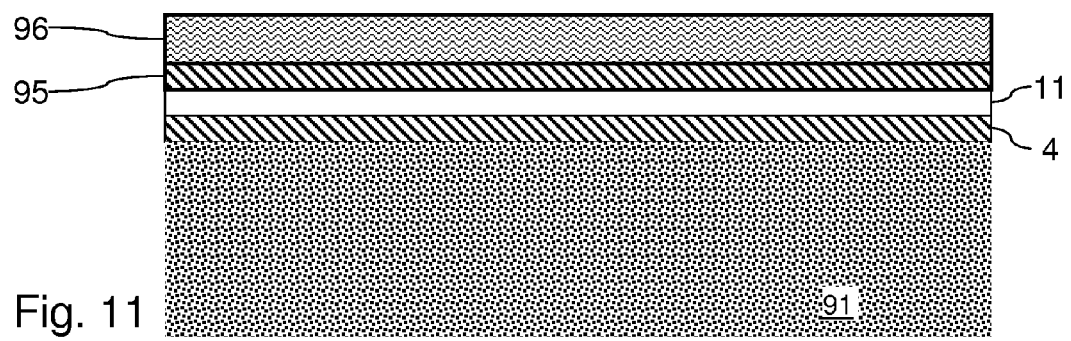

The advantage of the present invention will become apparent from the following description of several embodiments with reference to the accompanying drawings, in which:

FIG. 1 is a schematic cross-section view of a prior art integrated circuit of the dual STI type;

FIGS. 2 and 3 are examples of integrated circuits having different DSTI depths and different well biasing voltages;

FIG. 4 is a diagram illustrating the respective well to well leakage currents of the integrated circuits of FIGS. 2 and 3;

FIG. 5 is a diagram illustrating the well to well leakage depending on the doping of the well and of the deep n-well respectively, for a prior art integrated circuit;

FIG. 6 illustrates an example of a biasing configuration where well voltages are varied within a given range, for a prior art integrated circuit;

FIG. 7 is a diagram illustrating the well to substrate leakage current depending on the well bias, according to the prior art;

FIG. 8 is a diagram is a diagram illustrating the well to substrate leakage current depending on the well doping and depending on the deep n-well doping, according to the prior art;

FIGS. 9 and 10 are schematic cross-section views of integrated circuits according to different embodiments of the invention;

FIGS. 11 to 17 are schematic cross-section views of an integrated circuit according to an embodiment of the invention, at different steps of its manufacturing process.

According to the invention, a deep well extends beneath two FDSOI cells separated by a deep STI. The deep STI also separates two wells located beneath respective FDSOI cells. These wells have a type of doping different from the type of doping of the deep well. This deep well has an increased doping density under the deep STI. Thereby, both the leakage current between one well and the substrate and the leakage current between both wells are reduced.

FIGS. 9 and 10 are schematic cross-section views of a portion of an integrated circuit 9 according to two different embodiments of the invention. These embodiments share common technical features detailed below for one of these integrated circuits 9.

The integrated circuit 9 includes two cells. The first cell includes FDSOI transistors 1a and 1b, the second cell includes FDSOI transistors 1c and 1d. Each FDSOI transistor is either of the nMOS or pMOS type and has a structure known per se. The transistors 1a, 1b, 1c and 1d include respective gate stacks and respective active semiconductor layers (typically an active silicon layer). Each active semiconductor layer includes a source, a channel and a drain. A gate oxide layer covers the channel. Said gate oxide layer is covered by a gate stack comprising metal layers and polysilicon layers. These stacks are usually laterally delimited by spacers.

The source and drain of the active semiconductor layer are doped with impurities. As known in FDSOI technology, the channel has a very low doping level so as to be in a depleted state. For example, the doping concentration of the channel is lower than $10^{16}$ cm$^{-3}$.

The transistors 1a, 1b, 1c and 1d are located on an ultra-thin buried oxide (UTBOX) insulator layer 4. The oxide layer 4 lies below the active semiconductor layer of the transistors 1a, 1b, 1c and 1d and provides an electrical insulation between this semiconductor layer and a silicon substrate 91. The substrate 91 has typically a p-type doping with a doping level lower than $10^{16}$ cm$^{-3}$ and, preferentially, lower than $5*10^{15}$ cm$^{-3}$. In the so-called UTBOX technology, the oxide layer 4 has a reduced thickness. For example, the thickness of the oxide layer 4 is comprised between 10 nm and 100 nm and, preferably, comprised between 10 nm and 50 nm. With a UTBOX layer 4, it is possible to adjust the threshold voltages of the transistors 1a, 1b, 1c and 1d by using appropriate ground planes.

Semiconductor wells 93 and 94 are located below the UTBOX layer 4. The well 93 is located under the transistors 1a and 1b, the well 94 is located under the transistors 1c and 1d. With the p-type substrate 91, the semiconductor wells 93 and 94 have a p-type doping. A ground plane 31 lies beneath transistor 1b. A ground plane 32 lies beneath transistor 1c. The wells 93 and 94 have preferentially a doping level comprised between $10^{16}$ and $1*10^{19}$ cm$^{-3}$ and, preferentially, comprised between $5*10^{16}$ and $2*10^{18}$ cm$^{-3}$. The wells 93 and 94 may extend to a depth of up to 150 nm or 350 nm below the UTBOX layer 4.

The upper surface of ground planes 31 and 32 is contacting the UTBOX layer 4 while their lower surface contacts the wells 93 and 94 respectively. The upper part of wells 93 and 94 constitutes a ground plane under transistors 1a and 1d respectively. The upper part has preferentially a doping level comprised between $10^{18}$ and $5*10^{18}$ cm$^{-3}$. The lower part of well 94 has preferentially a doping level comprised between $5*10^{16}$ and $5*10^{17}$. Ground planes 31 and 32 have an n-type doping. The p-type substrate 91 is separated from wells 93 and 94 by a deep well 92 of the n-type.

A V1 biasing is applied on well 93. A V2 biasing is applied on well 94. A V3 biasing is applied on deep n-well 92. A V4 biasing is applied on substrate 91. The integrated circuit 9 can include a biasing circuit (not illustrated) programmed to apply appropriate and possibly distinct biasing voltages V1, V2, V3 and V4. To avoid additional biasing contacts and obtain an optimal integration density, the ground planes 31 and 32 are biased through wells 93 and 94 respectively. Thus, short shallow trench isolations (SSTI) 22 and 23 are used to guarantee a semiconductor continuity between the V1 bias contact, the well 93 and the ground plane 31. These short shallow trench isolations SSTIs 22 and 23 do not reach the bottom of well 93. Thus, the well 93 extends continuously beneath transistors 1a and 1b, under the SSTIs 22 and 23. Similarly, short shallow trench isolations (SSTI) 25 and 26 are used to guarantee a semiconductor continuity between the V2 bias contact, the well 94 and the ground plane 32. These short shallow trench isolations SSTI 25 and 26 do not reach the bottom of well 94. Thus, the well 94 extends continuously beneath transistors 1c and 1d, under the SSTIs 25 and 26. Direct biasing contacts for ground planes 31 and 32 are thus not necessary, which allows a higher density of integration.

To provide an electrical isolation for transistors 1a, 1b, 1c and 1d:
 transistor 1a is located between SSTI 22 and SSTI 23;
 transistor 1b is located between SSTI 23 and a deeper shallow trench isolation (DSTI) 24;
 transistor 1c is located between DSTI 24 and SSTI 25;
 transistor 1d is located between SSTI 25 and SSTI 26.

The integrated circuit 9 is designed to allow an independent biasing for the ground planes 31 and 32. The integrated circuit 9 also includes DSTIs 21, 27 and 28 located at the periphery of the cells. The DSTIs 21, 24, 27 and 28 cross the UTBOX layer 4, reach the deep well 92, without reaching the bottom of the deep well 92.

The deep well 92 includes a portion 33, the major part of which is located under DSTI 24. The portion 33 is in contact with DSTI 24. This portion 33 has the same type of doping as the remainder of the deep well 92. The doping density of portion 33 is at least 50% higher than the doping density of the deep well 92 under the shallow STIs 23 and 25, preferably at least 100% higher. The doping density of portion 33 may be for instance at least 50% higher than the average doping density of the deep well 92, preferably at least 100% higher. The doping density of portion 33 may be at least 50% higher than the doping density of the deep well 92 located plumb with the transistors 1a, 1b, 1c and 1d, preferably at least 100% higher.

The portion 33 reduces the leakage current between well 93 and well 94 when V1 and V2 voltages differ. This does not alter the leakage current between wells 93, 94 and the substrate 91, since a lower doping density can be used for the remainder of the deep well 92. The doping density of the deep well 92 under DSTIs 23 and 25 can be comprised between $5*10^{16}$ cm$^{-3}$ and $4*10^{18}$ cm$^{-3}$. Thereby, the integrated circuit 9 provides both a reduced leakage current between wells 93, 94 and the substrate 91, and a reduced leakage current between well 93 and well 94. The portion 33 is thus used as a barrier between wells 93 and 94, without significantly increasing the leakage current between wells and substrate through the major part of the deep well 92.

The average doping density of the deep well 92 is advantageously comprised between $2*10^{17}$ cm$^{-3}$ and $7*10^{17}$ cm$^{-3}$ The doping density of the portion 33 is advantageously comprised between $1*10^{18}$ cm$^{-3}$ and $5*10^{19}$ cm$^{-3}$.

As detailed afterwards, this improvement can be obtained without requesting major changes in the manufacturing process. This improvement is notably obtained without altering the properties of the channel of the FDSOI transistors.

The portion 33 extends advantageously on at least 30 nm, preferably at least 50 nm under the deep STI 24.

Opposite types of doping may be used with appropriate biasing for deep well 92, wells 93 and 94, and ground planes 31 and 32.

For applying voltage V3 on the deep well 92, a biasing contact is located between DSTIs 27 and 28. DSTI 27 notably isolates this biasing contact from the second cell. The deep well 92 comprises portions 34, whose major part is located beneath DSTIs 27 and 28. These portions 34 are in contact with DSTIs 27 and 28 respectively. These portions 34 have the same type of doping as the remainder of the deep well 92. The doping density of portions 34 is at least 50% higher than the doping density of the deep well 92 under the shallow STIs 23 and 25, preferably at least 100% higher. The doping density of portions 34 may be for instance at least 50% higher than the average doping density of the deep well 92, preferably at least 100% higher. The doping density of portion 34 may be at least 50% higher than the doping density of the deep well 92 located plumb with the transistors 1a, 1b, 1c and 1d, preferably at least 100% higher.

The portions 34 reduce the resistance between the biasing contact and the deep well 92. As disclosed below, these portions 34 may be created during the same manufacturing steps as portions 33.

In the embodiment of FIG. 9, the portion 33 does not reach the bottom of the deep well 92. The distance between the portion 33 and the bottom of the deep well 92 is advantageously comprised between 10 and 50 nm. Such a configuration provides an optimization of the well to substrate leakage.

In the embodiment of FIG. 10, the portion 33 extends into the bottom of the deep well 92 and reaches the substrate 91. Such a configuration provides an optimization of the well to well leakage.

Examples of manufacturing methods will now be disclosed. At FIG. 11, a p-type substrate 91 is provided. Substrate 91 is covered by a UTBOX layer 4. The UTBOX layer has typically a thickness between 10 and 50 nm. The UTBOX layer 4 is for instance a silicon oxide layer. The UTBOX layer 4 is covered by a semiconductor layer 11 (typically a silicon layer, having for instance a thickness comprised between 3 and 15 nm). Semiconductor layer 11 is typically covered by a pad oxide 95 (typically silicon oxide with a thickness between 3 and 15 nm) and a pad nitride 96 (typically silicon nitride with a thickness between 40 and 250 nm). The manufacturing method of this stack of layers is known per se from the prior art. Pad oxide 95 and pad nitride 96 may be replaced by one or more layers made out of different materials.

Figure 12:
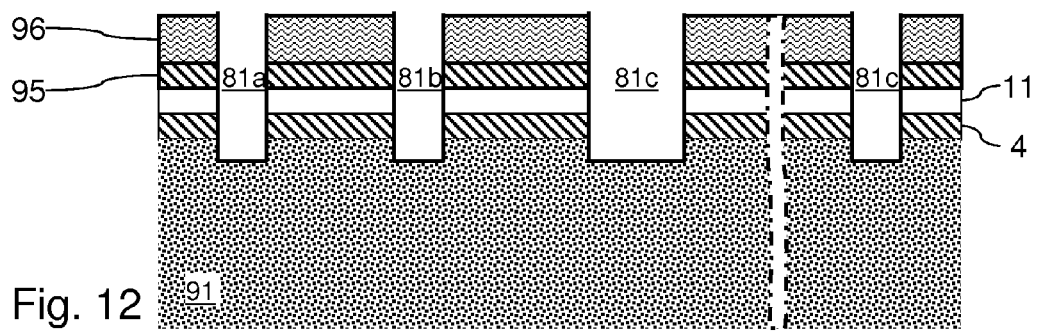

In FIG. 12, grooves 81a, 81b and 81c are formed through pad nitride 96, pad oxide 95, semiconductor layer 11 and UTBOX layer 4. The formed grooves 81a, 81b and 81c are deep enough to reach the substrate 91. These grooves 81a, 81b and 81c can be formed by an active area photolithography process, including patterning and etching steps. According to this example, grooves 81a, 81b and 81c are advantageously formed simultaneously and have the same depth after this step.

Figure 13:
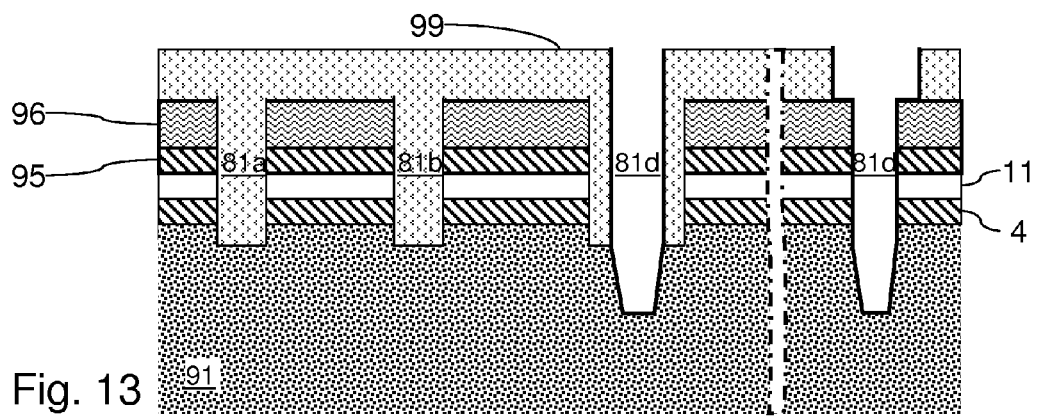
Figure 14:
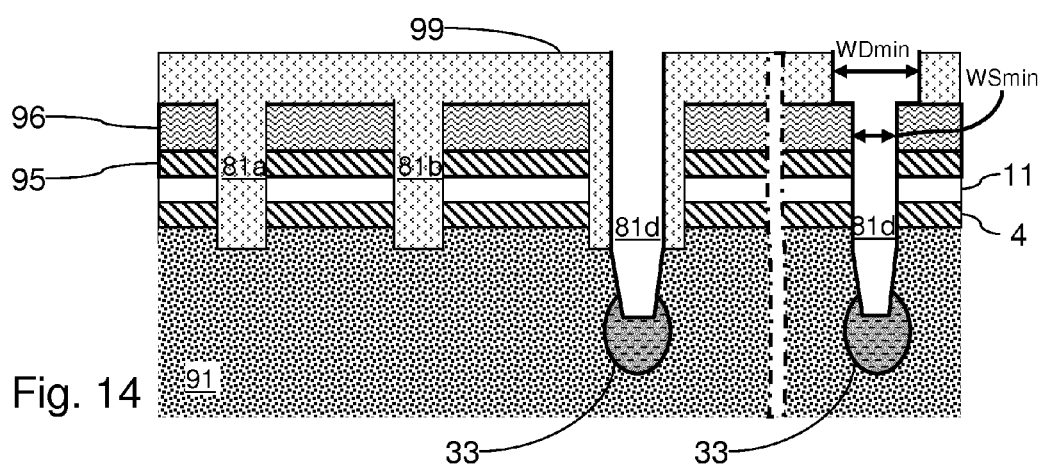

Two different configurations for groove 81c are illustrated on the right side of FIGS. 12 to 14. The left groove 81c is larger than grooves 81a and 81b. The right groove 81c has the same width as grooves 81a and 81b.

In FIG. 13, a mask 99 is patterned, for instance by photolithography. The mask 99 defines openings at locations where deeper shallow trench isolations are to be created. Grooves 81a and 81b are fully filled by mask 99. An etching step is performed after the mask 99 patterning. Groove 81c is deepened whereas grooves 81a and 81b keep the same depth. Two different depths are thereby obtained for these grooves. The depth of this deeper groove 81c may reach for instance between 130 and 400 nm in substrate 91.

In the left groove 81c, the sidewalls of this groove are covered by the patterned mask 99. The middle portion of the bottom of the groove 81c is uncovered by the patterned mask 99. Thus, the groove 81c can be deepened in its middle portion during the etching step. The lower part of deepened groove 81d is wider than grooves 81a and 81b.

In the right deepened groove 81d, the lower part has the same width as grooves 81a and 81b. The opening in the patterned mask 99 is wider (WDmin) than the width (WSmin) of grooves 81a and 81b. This opening can thereby benefit from the same alignment as grooves 81a and 81b. The same alignment rules can thus be used both for the deeper groove 81d and for shallower grooves 81a and 81b.

In FIG. 14, doped portions 33 are created in substrate 91, under the bottom of groove 81c. Portions 33 have an n-type doping, with a high density. Doped portions 33 may extend on both sides of groove 81d (for instance up to 10 to 20 nm from the sidewalls of groove 81d). Photoresist layer 99 is preferably kept for performing the creation of portions 33.

Previously described doped portions 34 are advantageously formed simultaneously, at the bottom of other deeper grooves (not illustrated).

Doped portions 33 are made for instance by inserting impurities into a silicon structure.

The semiconductor layer 11 is protected by pad nitride 96 and pad oxide 95. Thus, whatever the process used to create the doped portions 33, this process does not introduce impurities in the semiconductor layer 11 or the UTBOX layer 4. Thus, channels of the FDSOI transistors to be formed are not altered.

Amongst the possible methods for creating doped portions 33, the following methods may be used:
  ionic implantation (preferably with Arsenic or Phosphorus in a deep n-Well, or preferably Boron or $BF_2$ in a deep p-Well);
  plasma doping;
  vapor phase diffusion.

Conformal doping or non-conformal doping methods may be used.

For ionic implantation and plasma doping, species (like As, P, Se or S) can be used to create the doped portions at the bottom of groove 81d.

For ionic implantation, the following energy levels can be used:
  for the ionic implantation of arsenic, an energy level comprised between 3 keV and 100 keV with an implantation tilt between 0° and 30° is suitable;
  for the ionic implantation of phosphorous, an energy level comprised between 2 keV and 80 keV with an implantation tilt perpendicular to the surface is suitable.

The doping levels in the doped portion 33 are preferentially comprised between $1*10^{18}$ cm$^{-3}$ and $5*10^{19}$ cm$^{-3}$. In case ionic implantation is used to create the doped portion 33, pad nitride 96 is used as a shield and the upper surface of pad nitride 96 undergoes a ionic implantation.

Figure 15:
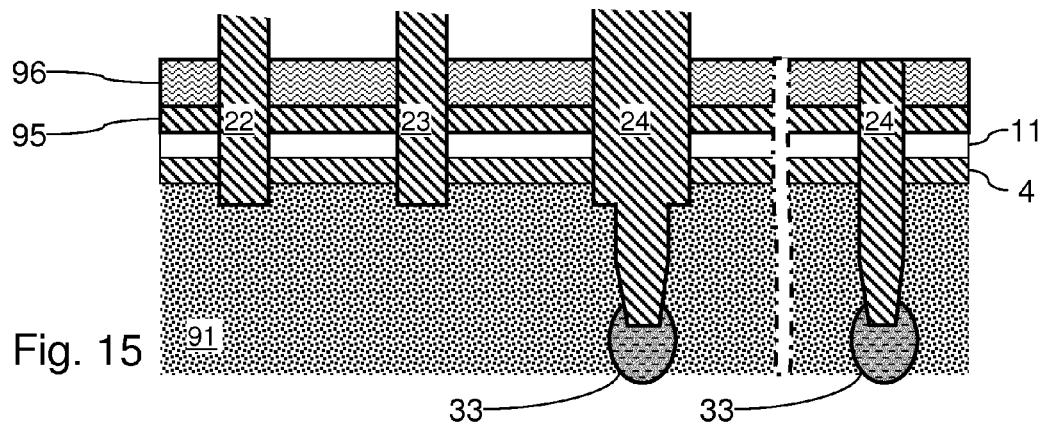

In FIG. 15, the mask 99 is initially removed by a process known per se. Grooves 81a, 81b and 81d are thus emptied. Grooves 81a, 81b and 81d are then filled with an appropriate isolation material, to form STIs 22, 23 and 24 respectively. The isolation material may for instance be silicon oxide. SSTIs 22 and 23 are obtained and a DSTI 24 is obtained as well.

Since the doped portion 33 is created at an early stage, before the shallow trench isolations are formed, the UTBOX layer 4 and the semiconductor layer 11 are protected by upper layers. In the embodiment illustrated, layers 4 and 11 are protected by pad nitride 96 and pad oxide 95, whatever the method chosen for creating the doped portion 33.

Figure 16:
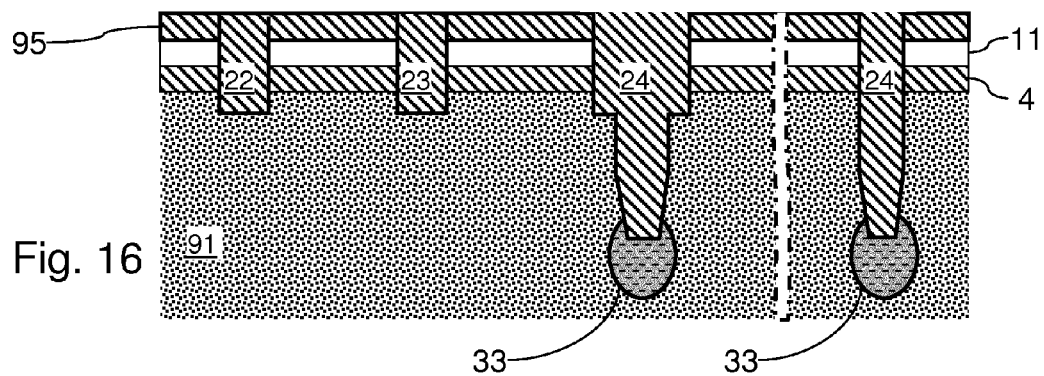

In FIG. 16, pad nitride may be removed by a chemical etching, for instance by using hot orthophosphoric acid. A chemical mechanical polishing may be performed to remove the upper portion of STIs 22, 23 and 24. These steps are known per se.

Figure 17:
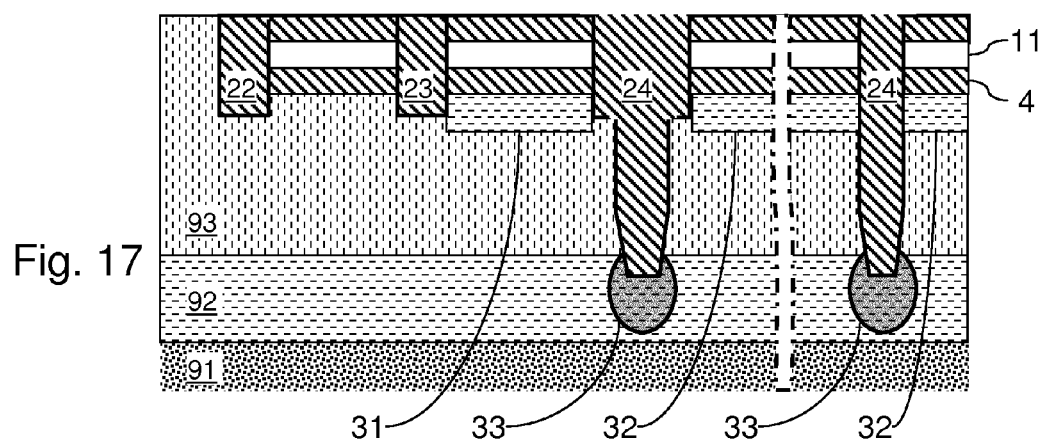

In FIG. 17, a deep n-Well 92 is formed in substrate 91, with a doping concentration lower than the doping concentration of portion 33. P-doped wells 93 and 94 are formed above deep n-well 92, on respective sides of STI 24. Wells 93 and 94 do not reach the bottom of STI 24 and are thereby separated. STI 24 extends into deep n-Well 92. N-doped ground planes 31 and 32 are formed under UTBOX layer 4 (respectively between STIs 23 and 24, and between STIs 24 and 25). Ground plane 31 is formed between well 93 and UTBOX layer 4. Ground plane 32 is formed between well 94 and UTBOX layer 4. In this embodiment, ground planes 31 and 32 contact the UTBOX layer 4. Ground planes 31, 32, wells 93, 94 and deep n-Well 92 may be formed by an appropriate ionic implantation, with appropriate energy levels, impurity materials and implantation densities.

The invention claimed is:

1. An integrated circuit, comprising:
   an ultra-thin buried oxide (UTBOX) insulator layer;
   a first cell, comprising:
     first and second fully-depleted silicon-on-insulator (FDSOI) field effect transistors located above the UTBOX layer;
     a first shallow trench isolation separating the first and second transistors;
     a first semiconductor ground plane having a first type of doping and located beneath the first transistor and beneath the UTBOX layer; and
     a first semiconductor well extending continuously beneath the first and second transistors and contacting the first semiconductor ground plane, the first semiconductor well having a second type of doping different from the first type of doping;
   a second cell, comprising:
     third and fourth FDSOI field effect transistors located above the UTBOX layer;
     a second shallow trench isolation separating the third and fourth transistors;
     a second semiconductor ground plane having the first type of doping and located beneath the third transistor and beneath the UTBOX layer; and
     a second semiconductor well extending continuously beneath the third and fourth transistors and contacting the second semiconductor ground plane, the second well having the second type of doping;
   a third shallow trench isolation separating the first and second cells, crossing the UTBOX layer and reaching a bottom of the first and second wells; and
   a deep well having the first type of doping and extending continuously beneath the first and second wells, a first portion of the deep well disposed beneath the third shallow trench isolation and having a doping density at least 50% higher than a doping density of another portion of the deep well disposed beneath the first and second shallow trench isolations.

2. The integrated circuit according to claim 1, wherein the doping density of the first portion of the deep well is at least 50% higher than an average doping density of the deep well.

3. The integrated circuit according to claim 1, wherein the first portion extends at least 30 nm under a bottom of the third shallow trench isolation.

4. The integrated circuit according to claim 1, wherein the first portion extends under a bottom of the deep well.

5. The integrated circuit according to claim 1, wherein a distance between the first portion and a bottom of the deep well is between 10 nm and 50 nm.

6. The integrated circuit according to claim 1, wherein the first type of doping is n type.

7. The integrated circuit according to claim 1, further comprising:
   a biasing contact for the deep well; and
   a fourth shallow trench isolation separating the biasing contact from the first and second cells, the deep well further comprising a second portion disposed beneath the fourth shallow trench isolation and having a doping density at least 50% higher than the doping density of said another portion of the deep well disposed beneath the first and second shallow trench isolations.

8. The integrated circuit according to claim 1, further comprising a biasing circuit programmed to bias the first and second wells with respective different voltages.

9. A method for manufacturing an integrated circuit, comprising:
   providing a stack including a semiconductor substrate, a UTBOX type insulator layer lying above the semiconductor substrate, and a semiconductor layer lying above the insulator layer;
   in the stack, forming first and second grooves;
   in the stack, forming a third groove, the third groove extending in the semiconductor substrate deeper than the first and second grooves and being located between the first and second grooves;
   doping a portion of the semiconductor substrate at the bottom of the third groove with a first type of doping;
   filling the first, second, and third grooves with insulation material to form first, second, and third shallow trench isolations respectively;
   doping part of the semiconductor substrate with the first type of doping to form a deep well extending deeper than the third shallow trench isolation and extending continuously below the first and second shallow trench isolations and contacting the doped portion, the doped portion having a doping density at least 50% higher than the doping density of the deep well beneath the first and second shallow trench isolations;
   doping part of the semiconductor substrate to form first and second wells on opposite sides of the third shallow trench isolation, the first and second wells having a second type of doping different from the first type and extending deeper than the bottom of the first and second shallow trench isolations, the third shallow trench isolation extending deeper than the bottom of the formed first and second wells;
   doping an upper portion of the first and second wells to form ground planes under the insulator layer, the formed ground planes having the first type of doping.

10. A method according to claim 9, further comprising:
    forming first and second FDSOI field effect transistors separated by the first shallow trench isolation;
    forming third and fourth FDSOI field effect transistors separated by the second shallow trench isolation, respective source, drain, and channel of each of the first to fourth transistors being formed in the semiconductor layer.

11. A method according to claim 9, wherein the doping the portion of the semiconductor substrate includes ionic implantation in the bottom of the third groove.

12. A method according to claim 9, wherein the doping the portion of the semiconductor substrate is performed by plasma doping.

13. A method according to claim 9, wherein the doped portion extends at least 30 nm under the bottom of the third groove.

14. A method according to claim 9, wherein the bottom of the doped portion extends into the bottom of the formed deep well.

\* \* \* \* \*